United States Patent

[11] 3,597,633

[72] Inventors Chikafusa Hirano
Kodaira-shi;
Norio Yokozawa, Fuchu-shi, both of, Japan
[21] Appl. No. 719,025
[22] Filed Apr. 5, 1968
[45] Patented Aug. 3, 1971
[73] Assignee Hitachi, Ltd.
Tokyo, Japan
[32] Priority Apr. 7, 1967
[33] Japan
[31] 42/28639

[54] DIODE BRIDGE TYPE ELECTRONIC SWITCH
10 Claims, 3 Drawing Figs.

[52] U.S. Cl. ........ 307/257, 307/259, 307/321, 307/248
[51] Int. Cl. ........ H03k 17/74
[50] Field of Search ........ 307/257, 321

[56] References Cited
UNITED STATES PATENTS

| | | | |
|---|---|---|---|
| 2,967,909 | 1/1961 | Rice | 307/257 |
| 2,972,065 | 2/1961 | Hayes | 307/321 |
| 3,071,701 | 1/1963 | Perreault | 307/257 |
| 3,222,547 | 12/1965 | Boan et al. | 307/257 |
| 3,471,715 | 10/1969 | Castelli | 307/257 |
| 2,885,663 | 5/1959 | Curtis | 307/257 |
| 3,042,800 | 7/1962 | Gluth | 307/257 |
| 3,179,817 | 4/1965 | Bounsall | 307/257 |

*Primary Examiner*—Donald D. Forrer
*Assistant Examiner*—Harold A. Dixon
*Attorney*—Craig, Antonelli & Hill

ABSTRACT: A diode bridge type electronic switch in which an electronic switch controlled by a control signal is provided between a first and a second control terminal of said diode bridge type electronic switch and fixed biases with different polarities are provided between a connection point of said electronic switch and said first control terminal and a connection point of said electronic switch and said second control terminal.

INVENTORS
CHIKAFUSA HIRANO
NORIO YOKOZAWA

BY Craig & Antonelli
ATTORNEYS

DIODE BRIDGE TYPE ELECTRONIC SWITCH

BACKGROUND OF THE INVENTION

1. Field of the Invention

This invention relates to the control circuit of a diode bridge type electronic switch, which is used more widely than other electronic switches because of its high accuracy and high speed switching action.

2. Description of the Prior Art

However, the control circuit of a prior art switching device is very complicated and has a high electric power consumption. The main reason for these defects lies in the fact that the device uses two control signals.

SUMMARY OF THE INVENTION

One object of this invention is to provide a diode bridge type electronic switch capable of being controlled by a simple control circuit.

Another object of this invention is to provide a diode bridge type electronic switch having low electric power consumption and high speed action.

Namely, this invention provides a diode bridge type electronic switch attaining a desired control by one control signal with the use of a simple mechanism. More particularly, this invention provides a diode bridge type electronic switch wherein a control bias voltage is applied between a pair of opposed connection points and a signal to be controlled is applied between another pair of opposed connection points, and wherein the signal to be controlled is on-off switched by a single switch controlling transistor, which is connected between the first mentioned pair of the opposed connection points and is on-off controlled by one control signal applied thereto.

DESCRIPTION OF THE PREFERRED EMBODIMENTS

Figures 1, 2, 3:
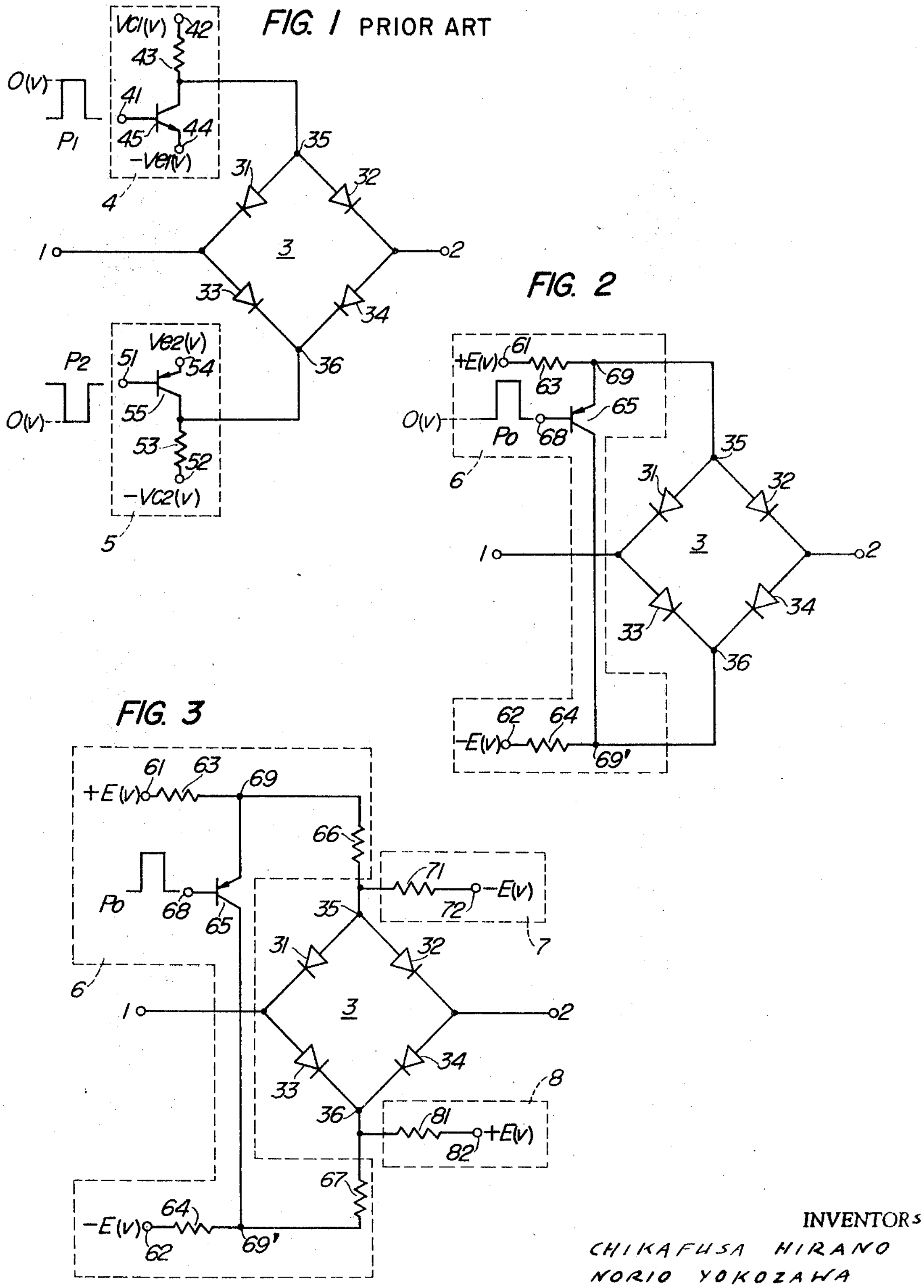
FIG. 1 PRIOR ART, FIG. 2, FIG. 3
FIG. 1 is an example of a prior art circuit diagram.
FIG. 2 shows an embodiment of this invention.
FIG. 3 shows another embodiment of this invention.

In order to fully understand this invention description of a typical prior art switching circuit will be made first with reference to FIG. 1. Numeral 3 is a diode bridge type switch consisting of diodes 31—34 connected in bridge form, control terminals 35 and 36, and input and output terminals 1 and 2 receiving a controlled signal. Numeral 4 is a transistor switch consisting of an NPN transistor 45, a base input terminal 41 receiving a control signal $P_1$, an emitter terminal 44 receiving a emitter supply voltage $V_{e1}$, a collector terminal 42 receiving a collector supply voltage $V_{c1}$, and a collector resistor 43. Numeral 5 is a transistor switc h consisting of an NPN transistor 55, a base input terminal receiving a control signal $P_2$, an emitter terminal 54 receiving an emitter supply voltage $V_{e2}$, a collector terminal receiving a collector supply voltage $V_{c2}$, and a collector resistor 53. In the absence of a control signal the transistors 45 and 55 are off while the diode bridge type switch 3 is on, the control terminals 35 and 36 having positive and negative electric potentials respectively. With application of a control signal the transistors 45 and 55 become on while the diode bridge type switch 3 becomes off, the control terminals 35 and 36 having negative and positive electric potentials respectively. In the normal state the control signal $P_1$ has a negative electric potential and the pulse signal has a positive polarity. As for the control signal $P_2$ its polarity if opposite to that of the first signal.

The above circuit requires two control signals which should have the same phase and two switches which are switched on and off in the same phase by the control signals. In the case of a high speed on-off action phase synchronization is surely needed between the control signals $P_1$ as well as $P_2$ and between the on-off action of transistors. The adjustment of such synchronization makes the device very complicated. Further, since the transistors 45 and 55 need a strong current when the device performs a high speed action, a high electric power is consumed.

FIG. 2 shows an embodiment of this invention. Numeral 3 is a diode bridge type switch constituted in the same manner as in FIG. 1. Numeral 6 is a control circuit where a fixed bias is provided together with a PNP type transistor. The fixed bias consists of a positive voltage +E(V) applied to a control terminal 35 through a resistor 63 and a negative voltage −E(V) applied to a control terminal 36 through a resistor 64. The PNP type transistor is provided between the terminals 69 and 69′ and is switched on and off by a control signal (pulse signal) $P_0$. The control signal applied to the base input terminal 68 of transistor 65 is a pulse signal having a positive polarity. In the absence of this control signal the transistor 65 is on and the terminals 69 and 69′ have an identical electric potential. Therefore, in an attempt to turn the switch 3 on, insufficient voltage appears between the control terminals 35 and 36 of the diode bridge type switch 3. So, the switch 3 is cut off. When a pulse signal having a positive polarity is applied, the transistor 65 is cut off and the fixed bias voltages +E(V) and −E(V) are applied at the control terminals 35 and 36 respectively of the diode bridge type switch 3. The switch is switched on and leads the signal applied at the input terminal 1 to the output terminal 2. The bias voltage +E(V) and −E(V) serve at the same time as the collector and emitter power voltages of transistor 65.

Another embodiment of this invention is shown in FIG. 3. This circuit is a modificaiton of the circuit shown in FIG. 2, accomplishing a high speed and high accuracy switching action. The circuit shown in FIG. 2 has the following defect in respect to accuracy. The resistance of transistor 65 under the conductive condition is very low but not absolutely zero. Therefore, in the on state a positive voltage drop appearing from the terminal 69 to terminal 69′ is applied between the control terminals 35 and 36. The voltage drop across the resistance under the conductive condition of the transistor 65 can be larger than the threshold value of the diodes in the diode bridge type switch 3. In such a case the switch is not completely cut off and induces a cause of error. Thus, it is impossible to obtain a highly accurate switch. The above switch is also defective in regard to speed. When the transistor 65 changes from the on- to the off-state, the switching speed of switch 3 is slowed down by the hole storage time of the diodes contained in the switch 3. Consider that a positive control pulse $P_{10}$ is applied to the transistor 65. When the control pulse $P_{10}$ is changed to negative (or zero), the transistor 65 rapidly changes from the off- to the on-state. The electric potential applied in the forward direction between the control terminal 35 and 36 in the switch 3 becomes equal to the voltage drop across the resistance under the conductive condition of the transistor 65. However, since this voltage drop can not be a sufficient reverse bias voltage to eliminate the hole storage effect of the diodes in switch 3, the hole storage time becomes very harmful to the high speed switching action.

In FIG. 3, resistors 66 and 67 inserted between the terminals 69 and 35 and the terminals 69′ and 36 respectively are provided to prevent the voltage drop across the resistance under the conductive condition of transistor 65 from being applied directly between the terminals 35 and 36. Numeral 7 is a first fixed bias means for applying a reverse bias voltage −E(V) to the terminal 35 through a resistor 71, and 8 is a fixed bias applying a reverse bias voltage +E(V) )to the terminal 36 through a resistor 81. Other reference numerals are used to denote parts similar to those in FIG. 2. Resistors 71 and 81 have, respectively, a relatively large resistance so as to give a sufficient forward bias to the diodes when the switch is on. When they are zero or small, the switch 3 has constantly a reverse bias and performs no switching action.

According to the above constitution, under normal conditions when the transistor 65 has a zero electric potential, the transistor 65 is on, a greater portion of the current flowing through the resistors 63 and 64 passes through the transistor 65, and the connection points 69 and 69′ are maintained nearly at zero electric potential. The control terminals 35 and 36 of the diode electronic switch 3 are maintained at a negative electric potential. As a result, the diode electronic switch is in an off-state. If a positive control signal is applied at the base of transistor 65 with the electric potential of the base maintained higher than that of the emitter, the transistor 65 is turned off. As a result, the control terminals 35 and 36 change rapidly to a positive and a negative electric potential respectively, switching the diode switch on. It is understood therefore, that the diode switch 3 can be controlled by only one control signal applied at the base of the transistor 65. Further, in this embodiment the provision of the resistors 66 and 67 together with the fixed bias 7 and 8 yield a higher accuracy and greater high speed action.

This invention may have many other modes of embodying the invention. For example, the transistor 65 may have a reverse connection, i.e. the terminals 69 and 69′ may be connected to the collector and the emitter side respectively where an NPN type transistor is used as the transistor 65. It is to be noted, however, that there is a common element among these modifications in that the bias voltages applied at the terminals 61 and 82 have the same polarity and that the bias voltages applied at the terminals 62 and 72 have also the same polarity opposite to the above polarity. Further, it is possible to use an electric field effect transistor instead of the transistor. It is also possible to decrease the current flowing through the resistors 71 and 81 by using diodes instead of the transistor 66 and 67.

Although a diode bridge type electronic switch may have many other kinds of bridges than those in the present embodiment, this invention can be applied to all of them. Further, this invention may be used for the electronic switches in a sample hold circuit and an integrator, etc.

In the above description, the bias voltages E(V) and −E(V) are shown but they are only an example and may take various values. Such values should be determined to satisfy the switching condition of the diode bridge type switch 3 under which the bias current is forced to flow from the terminal 35 to the terminal 36 without leaking out the input and output terminals 1 and 2.

Assuming now that different bias voltage $E_1(V)$ and $-E_2(V)$ are applied to the terminals 61 and 62, respectively and that the output voltage at the output terminal 2 is zero when the input voltage at the input terminal 1 is zero to obtain the switching condition, the following equation will be obtainable:

$$\frac{E_1-V_d}{R_1+\frac{R_d}{2}}=\frac{E_2-V_d}{R_2+\frac{R_d}{2}} \qquad (1)$$

wherein $R_1$ and $R_2$ are the resistances of the resistors 63 and 64, $V_d$ is the threshold voltage of each diode of the diode bridge type switch 3 and $R_d$ is the forward resistance of the diode.

Apparently, it is understood from Equation (1) that the bias voltage values $E_1$ and $E_2$ should be greater than that of the threshold voltage $V_t$, i.e. $E_1>V_d$ and $E_2>V_d$.

Since the bias voltage values $E_1$ and $E_2$ are related to the resistances $R_1$ and $R_2$, the switching condition of the embodiment shown in FIG. 2 is obtained as: $R_1=R_2$ (2) by substituting E for $E_1$ and $E_2$, i.e. $E=E_1=E_2$.

Equation (1) is definitely established under the condition that the transistor switch 65 coupled in parallel to the terminals 35 and 36 of the diode bridge type switch 3 is completely cut off to provide an infinite resistance, but actually the switching condition may be established so far as Equation (1) is approximately established. In other words, it is sufficient that the resistance of the transistor switch 65 is substantially larger in comparison to that of the diode bridge type switch 3 and that the input and output voltages are substantially equal to each other while the diode bridge type switch is in its on condition.

In the circuit of FIG. 3 the bias voltages applied to the terminals 61 and 62 are also not specifically limited to such values as specified, but may take various values, and the same switching condition as mentioned above may be obtained if the resistances of the resistors 71 and 81 are relatively larger than those of the series resistor circuits 63 and 66, and 64 and 67, respectively.

Further, the bias voltages applied to the terminals 72 and 82 may also take various values so long as they are great enough to render the diode bridge type switch 3 in its off condition.

We claim:

1. A diode bridge type electronic switching circuit having a diode bridge type switch and control means for on-off controlling said diode bridge type switch, wherein said diode bridge type switch comprises diodes connected in a bridge configuration with a first and second control terminal at a first pair of opposed connection points of said diodes and input and output terminals connected at a second pair of opposed connection points of said diodes, said diode bridge type switch having its conductive direction from said first to said second control terminals, and wherein said control means comprises:

first and third resistors connected to said first and second control terminals, respectively;

second and fourth resistors connected respectively in series to said first and third resistors;

means for supplying a first control voltage to said first control terminal through said second and first resistors;

means for supplying to said second control terminal through said fourth and third resistors a second control voltage having a polarity opposite to that of said first control voltage, said first and second control voltages being forwardly directed to said diode bridge type switch with respect to the forward direction thereof;

a switch controlling transistor connected in parallel between the connection point of said first and second resistors and the connection point of said third and fourth resistors;

means for applying an on-off control signal to the base of said transistor so as to render said transistor in its on and off states depending upon the on-off control signal, so that said transistor forms a parallel substantially shorting circuit between said first and second control terminals when it its on state;

a first bias means including a first bias resistor connected to said first control terminal for supplying a first bias voltage through said first bias resistor to said first control terminal; and a second bias means including a second bias resistor connected to said second control terminal for supplying to said second control terminal through said second bias resistor a second bias voltage having a polarity opposite to that of said bias voltage but being of the same polarity as that of the first control voltage, said first and second bias resistors having relatively large resistances with respect to those of the series resistor circuits of said first and third resistors and of said second and fourth resistors, whereby an input signal to be controlled which is applied to said input terminal is on-off controlled and an on-off controlled output signal is obtained from said output terminal.

2. A diode bridge type electronic switching circuit comprising:

a diode bridge type switch including diodes connected in a bridge configuration which is provided with first and second control terminals, input and output terminals and which has its forward direction from said first to said second control terminals;

a first bias means including a first resistor connected to said first control terminal, a second resistor connected in series with said first resistor and a first power source connected to said second resistor for applying a first bias voltage to said first control terminal;

a second bias means including a third resistor connected to said second control terminal, a fourth resistor connected in series with said third resistor and a second power source connected to said fourth resistor for applying a second bias voltage to said second control terminal, said first and second bias voltages having polarities opposite to each other;

a switch controlling transistor having an emitter electrode and a collector electrode, and being connected at one of said electrodes to the connection point between said first and second resistors and at the other of said electrodes at the connection point between said third and fourth resistors;

means for applying an on-off control signal to the base of said transistor so as to turn said transistor on and off, so that said transistor forms 2 parallel shorting circuit between said connection points when in its on state;

a third bias means including a fifth resistor connected to said first control terminal and a third power source connected to said fifth resistor for applying a third bias voltage to said first control terminal; and a fourth bias means including a sixth resistor connected to said second control terminal and a fourth power source connected to said sixth resistor for applying a fourth bias voltage to said second control terminal;

said third bias voltage having a polarity opposite to the polarities of said fourth and first bias voltages but being of the same polarity as the polarity of said second bias voltage, said fifth and sixth resistor having, respectively, a resistance relatively larger than those of the series resistors circuits of said first and second resistors and of said third and fourth resistors, and said first, second, third and fourth bias voltages providing a power supply for said switch when said transistor is turned off, while said third and fourth bias voltages provide a blocking potential to said diode bridge type switch when said transistor is turned on, whereby an input signal to be controlled which is applied to said input terminal in on-off controlled and an on-off controlled output signal is obtained from the output terminal.

3. A diode bridge type electronic switch circuit comprising:

a diode bridge type switch having first and second control terminals, an input terminal for receiving a signal to be controlled and an output terminal for deriving a controlled signal;

a switch controlling transistor acting as an electronic switch provided with its emitter and collector connected respectively with end portion of first and second resistors which are connected with said first and second control terminals and being switched on and off by a control signal applied to the base thereof;

means for applying a first bias voltage through a third resistor to a connection point of said electronic switch and the end portion said first resistor connected with said first control terminal;

means for applying a second bias voltage through a fourth resistor to a connection point of said electronic switch and the end portion of said second resistor connected with said second controlled terminal, said second bias voltage having a polarity opposite to that of said first bias voltage;

means for applying a third bias voltage to said first control terminal through a fifth resistor and having a polarity opposite to that of said first bias voltage; and means for applying a fourth bias voltage to said second control terminal through a sixth resistor and having a polarity opposite to that of said second bias voltage.

4. A diode bridge type electronic switching circuit comprising:

a diode bridge type switch having first and second control terminals, an input terminal for receiving an input signal to be controlled and an output terminal;

a single switch controlling transistor with its emitter collector connected in parallel with said first and second control terminals of said diode bridge type switch;

means for applying an on-off control signal to the base of said transistor so as to render said transistor in on and off states, so that said transistor forms a parallel shorting circuit between said first and second control terminals when in its on state;

means including a first resistor connected at one end thereof to said first control terminal for applying a first bias voltage through said first resistor to said first control terminal; and means including a second resistor connected at one end thereof to said second control terminal for applying a second bias voltage through said second resistor to the said second control terminal;

said first and second bias voltage having polarities opposite to each other and being applied as a power supply for said diode bridge type switch is on-off controlled in response to on-off states of said switch controlling transistor, respectively, whereby an input signal applied to said input terminal is on-off controlled and an on-off controlled output signal is obtained from said output terminal.

5. A diode bridge type electronic switching circuit according to claim 4, wherein said first and second bias voltages are so directed as to provide a forward bias voltage between said first and second control terminals of said diode bridge type switch.

6. A diode bridge type electronic switching circuit according to claim 4, further comprising a third resistor connected at one end thereof to said first control terminal of said diode bridge type switch and at the other end thereof to said one end of said first resistor, and a fourth resistor connected at one end thereof to said second control terminal of said diode bridge type switch and at the other end thereof to said one end of said second resistor, so that said switch controlling transistor is connected between the connection point of said first and third resistors and the connection point of said second and fourth resistors, whereby said diode bridge type switch is blocked so as to be turned off through said third and fourth resistors when said transistor is turned on.

7. A diode bridge type electronic switching circuit having a diode bridge type switch and control means for on-off switch controlling said diode bridge type switch, wherein said diode bridge type switch comprises diodes connected in a bridge configuration and has first and second control terminals at a first pair of opposed connection points of said diodes and input and output terminals at a second pair of opposed connection points of said diodes, said diode bridge type switch having its conductive direction from said first to said second control terminals, and wherein said control means comprises:

a single switch controlling transistor with its emitter and collector connected in parallel with said first and second control terminals of said diode bridge type switch;

a first resistor connected at one end thereof to said first control terminal;

a second resistor connected at one end thereof to said second control terminal;

means for supplying between said first and second control terminals through said first and second resistors, a control voltage which is directed in a forward direction with respect to the forward direction of said diode bridge type switch; and means for applying an on-off control signal to the base of said transistor, so as to render said transistor in its on and off states depending on the on-off control signal, whereby said transistor constitutes a parallel shorting circuit between said first and second control terminals when in its on state, so that an input signal to be controlled which is applied to said input terminal is on-off controlled and an on-off controlled output signal is obtained from said output terminal.

8. A diode bridge type electronic switching circuit according to claim 7, wherein said transistor is a PNP type transistor whose collector and emitter are connected to said first and second control terminals, respectively.

9. A diode bridge type electronic switching circuit according to claim 7, wherein said transistor is an NPN type transistor whose collector and emitter are connected to the second and first control terminals, respectively.

10. A diode bridge type electronic switching circuit according to claim 7, wherein said control voltage supplying means include a first supply means for supplying a first voltage to said first control terminal and a second supply means for supplying a second voltage having a polarity opposite to the polarity of said first voltage to said second control terminal.